US008836102B2

(12) United States Patent
Okada

(10) Patent No.: US 8,836,102 B2
(45) Date of Patent: Sep. 16, 2014

(54) MULTILAYERED SEMICONDUCTOR DEVICE, PRINTED CIRCUIT BOARD, AND METHOD OF MANUFACTURING MULTILAYERED SEMICONDUCTOR DEVICE

(71) Applicant: Canon Kabushiki Kaisha, Tokyo (JP)

(72) Inventor: Yuya Okada, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/798,558

(22) Filed: Mar. 13, 2013

(65) Prior Publication Data

US 2013/0264722 A1 Oct. 10, 2013

(30) Foreign Application Priority Data

Apr. 9, 2012 (JP) ................................ 2012-088555

(51) Int. Cl.
| | | |
|---|---|---|
| H01L 23/02 | (2006.01) | |
| H01L 21/00 | (2006.01) | |
| H01L 25/00 | (2006.01) | |
| H01L 23/00 | (2006.01) | |
| H01L 25/04 | (2014.01) | |

(52) U.S. Cl.
CPC .............. *H01L 25/04* (2013.01); *H01L 25/50* (2013.01); *H01L 2924/19107* (2013.01); *H01L 24/97* (2013.01); *H01L 2224/45147* (2013.01); *H01L 2224/32225* (2013.01); *H01L 2924/15311* (2013.01); *H01L 2224/48227* (2013.01); *H01L 2224/73265* (2013.01); *H01L 2224/45144* (2013.01); *H01L 2224/97* (2013.01); *H01L 2924/01047* (2013.01); *H01L 2224/49175* (2013.01)
USPC ............ 257/686; 257/E25.006; 257/E25.021; 257/E25.027; 257/E23.085; 438/109

(58) Field of Classification Search
USPC ........... 257/686, E25.006, E25.013, E25.021, 257/E25.027, E23.085; 438/109, FOR. 368, 438/FOR. 426
See application file for complete search history.

(56) References Cited

U.S. PATENT DOCUMENTS

| | | | | |
|---|---|---|---|---|
| 7,989,269 | B2 * | 8/2011 | Do et al. ........................ | 438/127 |
| 2007/0108582 | A1 * | 5/2007 | Karnezos ....................... | 257/686 |
| 2007/0194424 | A1 * | 8/2007 | Camacho et al. ............. | 257/686 |

FOREIGN PATENT DOCUMENTS

JP   4594777   12/2010

OTHER PUBLICATIONS

Q. Yu et al., "Effects of BGA Solder Geometry on Fatigue Life and Reliability Assessment", *Journal of Japan Institute of Electronics Packaging*, 1[4] pp. 278-283 (1998).

* cited by examiner

*Primary Examiner* — Jasmine Clark
(74) *Attorney, Agent, or Firm* — Fitzpatrick, Cella, Harper & Scinto

(57) ABSTRACT

Provided is a multilayered semiconductor device, including: a first semiconductor package including a first semiconductor element and a first wiring board; a second semiconductor package including: a second semiconductor element, a second wiring board and a first encapsulating resin for encapsulating the second semiconductor element therein; and a plate member disposed between the first semiconductor package and the second semiconductor package, the first semiconductor package, the plate member, and the second semiconductor package being stacked in this order, in which the first wiring board and the second wiring board are electrically connected to each other via a metal wire through one of a notch and an opening formed in the plate member and the first semiconductor element, the second semiconductor package, and the metal wire are encapsulated in a second encapsulating resin.

12 Claims, 11 Drawing Sheets

MULTILAYERED SEMICONDUCTOR DEVICE, PRINTED CIRCUIT BOARD, AND METHOD OF MANUFACTURING MULTILAYERED SEMICONDUCTOR DEVICE

BACKGROUND OF THE INVENTION

1. Field of the Invention

The present invention relates to a multilayered semiconductor device in which a second semiconductor package is stacked on a first semiconductor package, a printed circuit board including a multilayered semiconductor device, and a method of manufacturing a multilayered semiconductor device.

2. Description of the Related Art

As electronic equipment such as a portable information device, a digital still camera, or a digital video camera becomes smaller and more sophisticated in functionality, a semiconductor device is required to be more densified and miniaturized. In order to respond to these demands, a multilayered semiconductor device is under development.

As a multilayered semiconductor device, there is a multi chip package (MCP) type multilayered semiconductor device in which multiple semiconductor elements are stacked. However, it is difficult to conduct a performance test with regard to a single semiconductor element, and thus, until the MCP type multilayered semiconductor device is completed, whether the multiple semiconductor elements operate or not cannot be found out. The yield of the completed MCP type multilayered semiconductor device is the product of the yields of the respective semiconductor elements, and thus, is significantly reduced. Further, as the number of the semiconductor elements to be stacked increases, the yield is reduced more.

On the other hand, a performance test of a semiconductor element is easy under a state in which the semiconductor element is contained in a semiconductor package, and thus, in order to manufacture a multilayered semiconductor device with an enhanced yield, it is desired to stack semiconductor packages whose performance tests have been conducted and whose nondefectiveness is guaranteed.

Accordingly, as a multilayered semiconductor device, a package in package (PiP) type multilayered semiconductor device has been developed (see Japanese Patent No. 4594777). In a multilayered semiconductor device of this kind, a second semiconductor package which is encapsulated in a resin is stacked on a first semiconductor package, and the second semiconductor package is, together with a semiconductor element in the first semiconductor package, encapsulated in another resin. A wiring board of the first semiconductor package and a wiring board of the second semiconductor package are connected via metal wires.

The thickness of the encapsulating resin in the PiP type multilayered semiconductor device proposed in the above-mentioned Japanese Patent No. 4594777 is larger than the thickness of the encapsulating resin in an MCP type multilayered semiconductor device in which multiple semiconductor elements are stacked. For example, the thickness of the multiple semiconductor elements in an MCP type multilayered semiconductor device is about 50 μm to 100 μm, while the thickness of the second semiconductor package in a PiP type multilayered semiconductor device is 500 μm or more. Therefore, in a PiP type multilayered semiconductor device, the ratio of the volume of the encapsulating resin including the encapsulating resin of the second semiconductor package to the volume of the multilayered semiconductor device is considerably large.

By the way, a semiconductor element is formed of a semiconductor such as Si. On the other hand, a wiring board of a semiconductor package which is electrically connected to a semiconductor element is formed of an organic material having a linear expansion coefficient larger than that of the semiconductor element and copper foil as a wiring layer.

Therefore, generally, as a material of the encapsulating resin, a material having a linear expansion coefficient close to that of the semiconductor element is selected to reduce the inconsistency in linear expansion coefficient between the semiconductor element and the wiring board and to protect the electrically connecting portion between the semiconductor element and the wiring board. Therefore, compared with a case of an MCP type multilayered semiconductor device, thermal expansion in a PiP type multilayered semiconductor device is considerably small.

A multilayered semiconductor device as described above is, in electronic equipment such as a portable information device, a digital still camera, or a digital video camera, electrically connected to a main board which is a printed wiring board via a solder ball as an external connection terminal. The main board is formed of a glass epoxy resin (13 to 40 ppm) having a linear expansion coefficient larger than those of a semiconductor element and an encapsulating resin of the multilayered semiconductor device and copper foil as wiring (15 to 20 ppm). In the case where the temperature in the electronic equipment rises due to a use environment or heat generation when an electronic component or a semiconductor device in the electronic equipment operates, the multilayered semiconductor device and the main board thermally expand.

However, in a PiP type multilayered semiconductor device, the ratio of the volume of the encapsulating resin to the volume of the entire multilayered semiconductor device is considerably larger than that in an MCP type multilayered semiconductor device. Further, the linear expansion coefficient of the encapsulating resin is considerably smaller than that of the main board, and thus, thermal expansion of the PiP type multilayered semiconductor device is smaller than thermal expansion of the main board.

Therefore, when the multilayered semiconductor device and the main board thermally expand, the amount of displacement of a connecting surface between the external connection terminal such as a solder ball and the wiring board is smaller than the amount of displacement of a connecting surface between the external connection terminal and the main board. Due to the difference in the amounts of displacement, a large distortion occurs in the external connection terminal such as a solder ball, and the distortion is accumulated in the external connection terminal as metal fatigue.

As the electronic equipment is repeatedly operated, distortion also occurs repeatedly, and metal fatigue is accumulated in the external connection terminal, which finally results in fracture of the external connection terminal. In particular, an external connection terminal located in a corner of the multilayered semiconductor device is farthest from the center of the multilayered semiconductor device, and thus, the amount of displacement between the multilayered semiconductor device and the main board is the largest, which causes the distortion to be the largest. As a result, the external connection terminal located in a corner of the multilayered semiconductor device is likely to fracture first among all the external connection terminals between the multilayered semiconductor device and the main board.

As described above, a PiP type multilayered semiconductor device having a structure in which a semiconductor package encapsulated in an encapsulating resin having a linear expansion coefficient is small is further encapsulated in another encapsulating resin has a problem that the reliability of the connection of the multilayered semiconductor device after being connected to the main board is low.

SUMMARY OF THE INVENTION

Accordingly, an object of the present invention is to improve the reliability of the connection between a multilayered semiconductor device and a printed wiring board.

According to an exemplary embodiment of the present invention, there is provided a multilayered semiconductor device including: a first semiconductor package including a first wiring board having a first semiconductor element mounted on one surface thereof and having a plurality of connection pads for electric connection to an outside formed on another surface thereof; a second semiconductor package including a second wiring board having a second semiconductor element mounted on one surface thereof; and a first encapsulating resin for encapsulating the second semiconductor element therein; and a plate member disposed between the first semiconductor package and the second semiconductor package. The first semiconductor package, the plate member, and the second semiconductor package are stacked in this order. The first wiring board and the second wiring board are electrically connected to each other via a metal wire through one of a notch and an opening formed in the plate member. The first semiconductor element, the second semiconductor package, and the metal wire are encapsulated in a second encapsulating resin.

According to another exemplary embodiment of the present invention, there is provided a method of manufacturing a multilayered semiconductor device, the method including a step of arranging a plurality of first semiconductor packages; a step of disposing a plate member on each of the plurality of first semiconductor packages, the plate member having a linear expansion coefficient which is larger than a linear expansion coefficient of a first encapsulating resin and having one of a notch and an opening formed therein; a first fixing step of fixing the plurality of the plate members to the plurality of first semiconductor packages, respectively; a step of supplying a plurality of second semiconductor packages onto each of the plurality of the plate members; a second fixing step of fixing the plurality of second semiconductor packages to the plurality of the plate members, respectively; a step of electrically connecting each of a plurality of first wiring boards and each of a plurality of second wiring boards via the one of the notch and the opening by using metal wires; a step of collectively encapsulating a plurality of first semiconductor elements, the metal wires, and the plurality of second semiconductor packages in a second encapsulating resin, the second encapsulating resin having a linear expansion coefficient smaller than a linear expansion coefficient of the plurality of the plate members; and a step of dividing a plurality of the multilayered semiconductor devices by and cutting the second encapsulating resin.

According to the present invention, the plate member having a linear expansion coefficient larger than those of the first and second encapsulating resins intervenes between the first semiconductor package and the second semiconductor package, and thus, displacement of the rim of the plate member due to thermal expansion can be increased. This can increase the displacement of the first wiring board due to thermal expansion. Therefore, the difference between the amount of displacement of one surface of the first wiring board and the amount of displacement of a surface of the printed wiring board opposed to the one surface becomes smaller, and the distortion force on external connection terminals connected to the pads can be reduced. Thus, the reliability of the connection to the printed wiring board can be improved.

Further features of the present invention will become apparent from the following description of exemplary embodiments with reference to the attached drawings.

DESCRIPTION OF THE EMBODIMENTS

Embodiments for carrying out the present invention are described in detail in the following with reference to the attached drawings.

(First Embodiment)

Figure 1A:
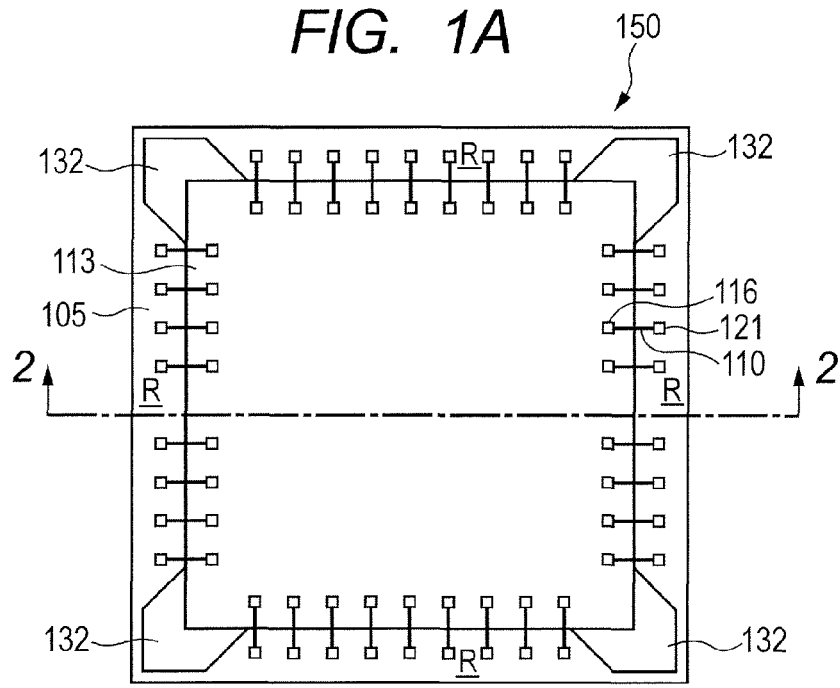
FIGS. 1A and 1B are schematic views of a multilayered semiconductor device according to a first embodiment of the present invention.
Figure 1B:
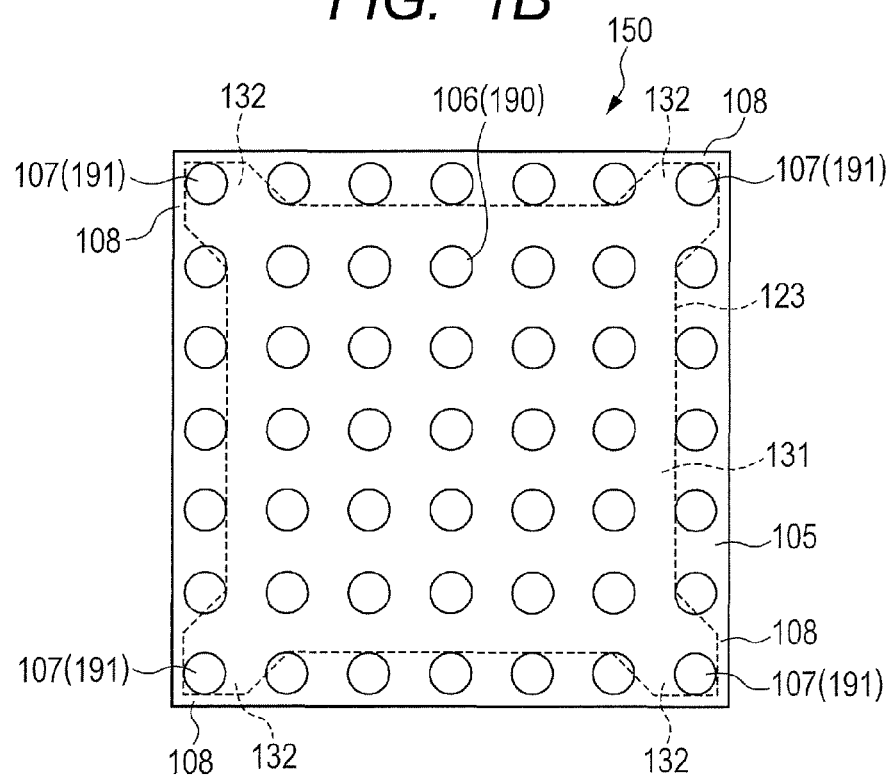
Figure 2A:
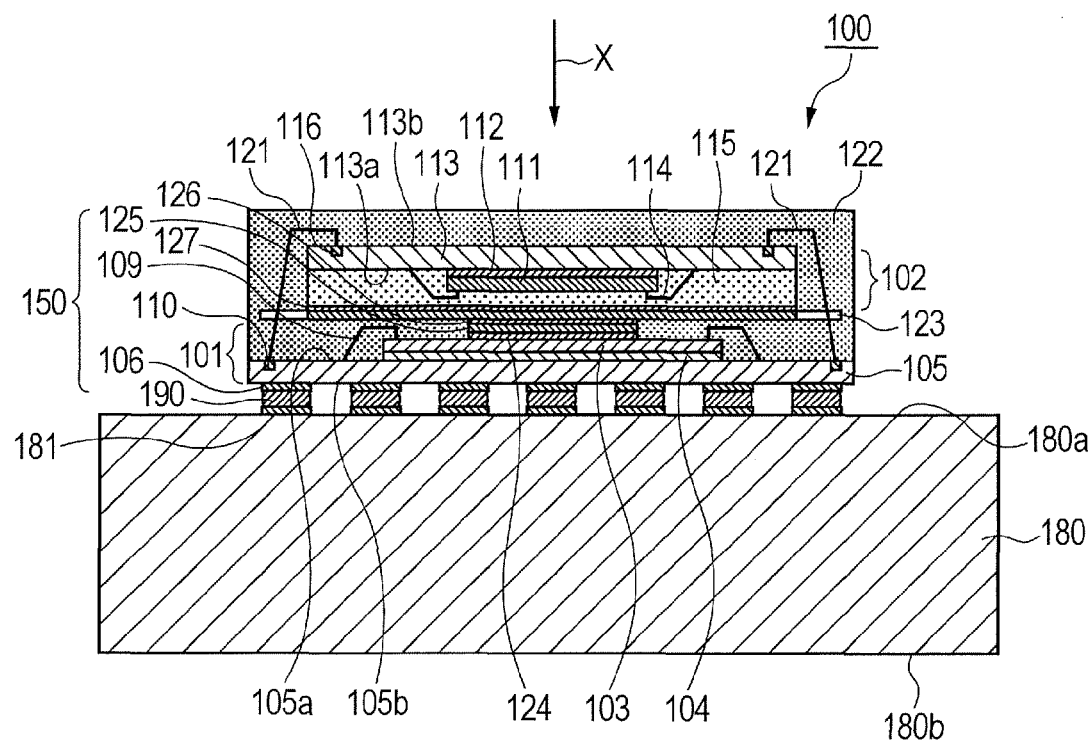
FIG. 2A is a sectional view taken along the line 2-2 of FIG. 1A.

FIGS. 1A and 1B are explanatory diagrams illustrating a schematic structure of a multilayered semiconductor device of a printed circuit board according to a first embodiment of the present invention. FIG. 1A is a plan view of the multilayered semiconductor device while FIG. 1B is a bottom view of the multilayered semiconductor device. FIG. 2A is a sectional view taken along the line 2-2 of FIG. 1A.

As illustrated in FIG. 2A, a printed circuit board 100 includes a multilayered semiconductor device 150 and a main board 180 which is a printed wiring board. The multilayered semiconductor device 150 is mounted on one surface 180a of surfaces 180a and 180b of the main board 180. The multilayered semiconductor device 150 is a package in package (PiP) type multilayered semiconductor device, and includes a first semiconductor package 101 and a second semiconductor package 102 stacked on the first semiconductor package 101.

First, the first semiconductor package 101 includes a first semiconductor chip 103 as a first semiconductor element and a first wiring board 105. The first wiring board 105 is an interposer which has the shape of a square and which has one surface 105a and the other surface 105b on a side opposite to the one surface 105a. The first semiconductor chip 103 is mounted on the one surface 105a of the first wiring board 105, and multiple pads 106 which are formed of a conductor and to which external connection terminals 190 are connected are formed on the other surface 105b. As illustrated in FIG. 1B, the multiple pads 106 are arranged in spaced arrays.

As illustrated in FIG. 2A, the first semiconductor chip 103 is formed so as to have a smaller area than the area of the first wiring board 105 seen from a direction of an arrow X which is a direction perpendicular to (direction of the normal to) the surface 105a (or the surface 105b) of the first wiring board 105. The first semiconductor chip 103 is provided in a face up state on the one surface 105a of the first wiring board 105, and is adhered and fixed to the one surface 105a of the first wiring board 105 with an adhesive 104 as a bonding member. The first semiconductor chip 103 is electrically connected to the one surface 105a of the first wiring board 105 via multiple metal wires 109.

Note that, the first semiconductor package 101 may be structured to have an encapsulating resin for encapsulating the first semiconductor chip 103, the one surface 105a of the first wiring board 105, and the metal wires 109, but, in the first embodiment, a case in which the first semiconductor package 101 does not have such an encapsulating resin is described.

Further, the first semiconductor chip 103 may be mounted in a face down state on the one surface 105a of the first wiring board 105. In this case, the first semiconductor chip 103 may be structured to be electrically connected to the one surface 105a of the first wiring board 105 via a protruding electrode of the first semiconductor chip 103. In that case, it is preferred that the protruding electrode between the first semiconductor chip 103 and the first wiring board 105 be protected by an encapsulating resin. When the first semiconductor chip 103 is mounted in a face down state on the first wiring board 105, a solder bump, a Cu bump, or an Au bump can be used as the protruding electrode. Further, a thermosetting resin containing silica can be used as the resin between the first semiconductor chip 103 and the first wiring board 105.

The second semiconductor package 102 includes a second semiconductor chip 111 as a second semiconductor element and a second wiring board 113. The second wiring board 113 is an interposer which has the shape of a square and which has one surface 113a and the other surface 113b on a side opposite to the one surface 113a. The second wiring board 113 is formed so as to have a smaller area than the area of the first wiring board 105 seen from the direction of the arrow X. The second wiring board 113 is disposed within the region of the first wiring board 105 so as not to extend farther from the rim of the first wiring board 105 seen from the direction of the arrow X and overlies the first wiring board 105.

The second semiconductor chip 111 is mounted on the one surface 113a of the second wiring board 113. The second semiconductor chip 111 is formed so as to have a smaller area than the area of the second wiring board 113 seen from the direction of the arrow X. The second semiconductor chip 111 is provided in a face up state on the one surface 113a of the second wiring board 113, and is adhered and fixed with an adhesive 112. The second semiconductor chip 111 is electrically connected to the one surface 113a of the second wiring board 113 via metal wires 114. The one surface 113a of the second wiring board 113, the second semiconductor chip 111, and the metal wires 114 are encapsulated in a first encapsulating resin 115.

Note that, the second semiconductor chip 111 may be mounted in a face down state on the one surface 113a of the second wiring board 113. In this case, the second semiconductor chip 111 may be structured to be electrically connected to the one surface 113a of the second wiring board 113 via a protruding electrode of the second semiconductor chip 111.

In the first embodiment, the one surface 105a of the first wiring board 105 and the one surface 113a of the second wiring board 113 are disposed so as to be opposed to each other. The one surface 105a of the first wiring board 105 has multiple electrodes 110 (FIG. 1A) formed thereon, while the other surface 113b of the second wiring board 113 has multiple electrodes 116 (FIG. 1A) formed thereon. The electrodes 110 and the electrodes 116 are electrically connected via metal wires 121, respectively. The first wiring board 105 and the second wiring board 113 are connected via the multiple metal wires 121 in this way, and thus, compared with a case in which connection is made via solder balls, the wiring density can be improved. As the metal wires 109, 114, and 121 of the first embodiment, for example, gold wires, copper wires, or silver wires can be used.

The first semiconductor chip 103 is, for example, a CPU, and the second semiconductor chip 111 is, for example, a memory. The first semiconductor chip 103 and the second semiconductor chip 111 transmit a signal to each other and receive a signal from each other via the wiring boards 105 and 113 and the metal wires 121. The number of the first semiconductor chips 103 may be one or more, and the number of the second semiconductor chips 111 may be one or more.

As illustrated in FIG. 2A, the one surface 105a of the first wiring board 105, the first semiconductor chip 103, the metal wires 121, and the second semiconductor package 102 are encapsulated in a second encapsulating resin 122. The resin material of the second encapsulating resin 122 may be the same as the resin material of the first encapsulating resin 115 or may be different from the resin material of the first encapsulating resin 115.

Multiple pads 181 formed of a conductor are formed on the one surface 180a of the main board 180 which is a printed wiring board at locations opposed to the pads 106 formed on the first wiring board 105 of the multilayered semiconductor device 150. The pads 106 and the pads 181 are electrically and physically connected via the external connection terminals 190, respectively. As the external connection terminals 190, for example, solder balls, rigid balls coated with solder, Cu pillars, or Au pillars can be used.

In the first embodiment, the multilayered semiconductor device 150 includes a plate member 123 which intervenes between the first semiconductor package 101 and the second semiconductor package 102. The plate member 123 has notches or openings formed therein. In the first embodiment, the plate member 123 intervenes between the first semiconductor chip 103 and the first encapsulating resin 115.

The plate member 123 is a member having a linear expansion coefficient larger than those of the first and second encapsulating resins 115 and 122, and, in the first embodiment, is encapsulated in the second encapsulating resin 122 together with the first semiconductor chip 103, the metal wires 121, and the second semiconductor package 102. The metal wires 121 electrically connect the wiring board 105 and the wiring board 113 through the notches or the openings in the plate member 123.

A spacer 125 is adhered onto the first semiconductor chip 103 with an adhesive 124. The plate member 123 is adhered onto the spacer 125 with an adhesive 126. Note that, when the first semiconductor chip 103 is mounted in a face down state on the one surface 105a of the first wiring board 105, the spacer 125 is unnecessary, and the plate member 123 is adhered to an exposed surface of the semiconductor chip 103 with an adhesive. The first encapsulating resin 115 of the second semiconductor package 102 is adhered onto the plate member 123 with an adhesive 127.

With regard to the materials of the first embodiment, as the adhesives 104, 112, 124, 126, and 127 which are bonding members, for example, a thermosetting resin sheet can be used, and, as the encapsulating resins 115 and 122, for example, a thermosetting resin containing silica can be used. In that case, the linear expansion coefficients of the adhesives 104, 112, 124, 126, and 127 are about 5.0 to 8.0E-05/K, and the linear expansion coefficients of the encapsulating resins 115 and 122 are about 0.9 to 1.3E-05/K.

Further, with regard to the main board 180, for example, as a base material, a glass epoxy resin can be used, and, as a wiring layer, copper foil can be used. In that case, the linear expansion coefficient of the main board 180 is about 1.4 to 1.6 E-05/K.

Further, it is preferred that the linear expansion coefficient of the plate member 123 which is larger than those of the encapsulating resins 115 and 122 be larger than that of the main board 180. For example, with regard to the material of the plate member 123, as a resin material, an epoxy resin having a linear expansion coefficient of about 4 to 8 E-05/K can be used, and, as a metal material, a copper-based alloy having a linear expansion coefficient of about 1.7 E-05/K can be used.

Specifically, the first encapsulating resin 115 and the second encapsulating resin 122 are formed of resins having linear expansion coefficients close to those of the first semiconductor chip 103 and the second semiconductor chip 111 in order to protect the first semiconductor chip 103 and the second semiconductor chip 111. Therefore, the linear expansion coefficient of the main board 180 is larger than those of the semiconductor chips 103 and 111 and the encapsulating resins 115 and 122. Further, the multilayered semiconductor device 150 is of a PiP type, and thus, the thickness of the encapsulating resin thereof in the direction of the arrow X is larger than that of an MCP type multilayered semiconductor device.

Therefore, according to the first embodiment, the linear expansion coefficient of the plate member 123 is larger than those of the encapsulating resins 115 and 122. This can increase the displacement of the rim of the plate member 123 due to thermal expansion, and thus, the displacement of the first wiring board 105 due to thermal expansion can be increased. Therefore, the difference between the amount of displacement of the one surface 105a of the first wiring board 105 and the amount of displacement of the surface 180a of the main board 180 opposed thereto becomes smaller. Thus, the distortion force on the external connection terminals 190 can be reduced, and distortion of the external connection terminals 190 can be reduced. This can inhibit fracture which occurs at connecting surfaces between the pads 106 and the external connection terminals 190 and at connecting surfaces between the external connection terminals 190 and the pads 181, and the reliability of the connection between the multilayered semiconductor device 150 and the main board 180 can be improved. Therefore, the life of the multilayered semiconductor device 150 can be increased.

Further, the linear expansion coefficient of the plate member 123 is larger than that of the main board 180, and thus, the inconsistency in displacement due to thermal expansion between the multilayered semiconductor device 150 and the main board 180 can be more effectively reduced.

In this case, the greatest distortion force due to thermal expansion of the multilayered semiconductor device 150 and the main board 180 acts on four external connection terminals 191 located in four corners 108 of the first wiring board 105 illustrated in FIG. 1B, among the multiple external connection terminals 190.

In the first embodiment, as illustrated in FIGS. 1A and 1B, the plate member 123 includes a substantially square plate body 131 having an area which is smaller than the area of the first wiring board 105 seen from the direction of the arrow X (FIG. 2A), and four protruding pieces 132 which protrude from respective corners of the plate body 131. These form the notches through which the metal wires 121 for connecting the first wiring board 105 and the second wiring board 113 are passed.

Each of the protruding pieces 132 is formed so as to protrude from the plate body 131 to the location of one of four corner pads 107 disposed in respective four corners 108 of the first wiring board 105 among the multiple pads 106 seen from the direction of the arrow X.

In this way, the first wiring board 105 has the shape of a square, and thus, it is preferred that the plate member 123 have four protruding pieces 132 so as to correspond to the four corners 108. Note that, the number of the protruding pieces 132 may be less than four, and is not limited to four. In this case, a region R between adjacent two protruding pieces 132 is a region for routing the metal wires 121.

By providing the protruding pieces 132 in this way, the distortion force on the external connection terminals 191 connected to the corner pads 107 can be effectively reduced while the regions R through which the metal wires 121 are routed are secured. Further, the plate member 123 can reduce not only distortion of the external connection terminals 191 located in the four corners 108 of the first wiring board 105 but also distortion of external connection terminals therearound. This can effectively inhibit fracture which occurs at the connecting surfaces between the pads 106 and the external connection terminals 190 (in particular, connecting surfaces between the corner pads 107 and the external connection terminals 191) and at the connecting surfaces between the external connection terminals 190 (in particular, external connection terminals 191) and the pads 181. Therefore, the reliability of the connection between the multilayered semiconductor device 150 and the main board 180 can be improved, and the life of the multilayered semiconductor device 150 can be increased.

Figure 2B:
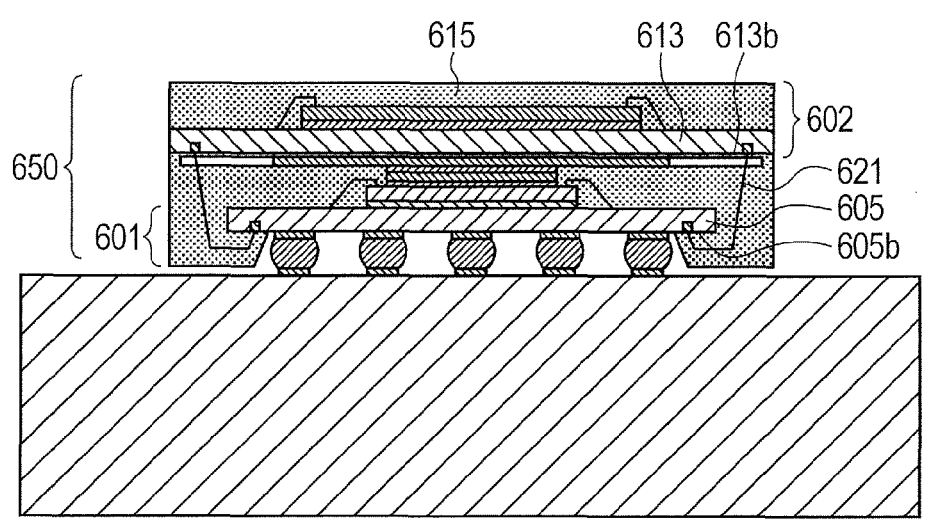
FIG. 2B is a schematic view of a multilayered semiconductor device according to a first embodiment of the present invention.

As illustrated in FIG. 2B, a second semiconductor package 602 of the first embodiment may be larger than a first semiconductor package 601. In this case, one surface 605b of a first wiring board 605 is electrically connected to one surface 613b of a second wiring board 613 with a metal wire 617. A metal wire 621 connected to the one surface 605b of the first wiring board 605 and a part of the one surface 605b of the first wiring board 605 are encapsulated with a resin.

Figure 2C:
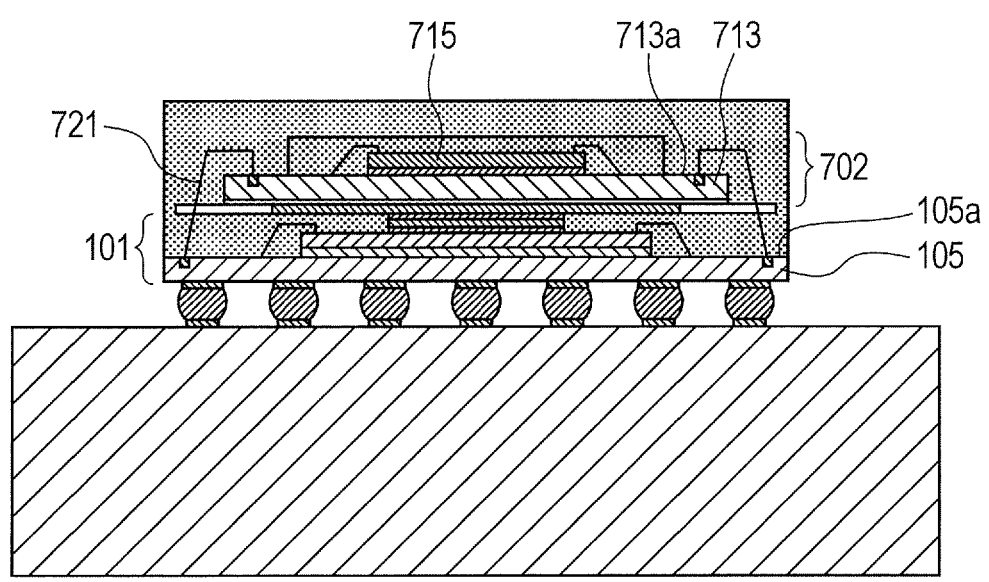
FIG. 2C is a schematic view of a multilayered semiconductor device according to a first embodiment of the present invention.

As illustrated in FIG. 2C, a part of one surface 713a of a second wiring board 713 of a second semiconductor package 702 of the first embodiment may be exposed from a first encapsulating resin 715. In this case, the one surface 713a of the second wiring board 713, which has been exposed from the encapsulating resin 715, is electrically connected to one surface 105a of a first wiring board 105 with a metal wire 721.

Figure 3A:
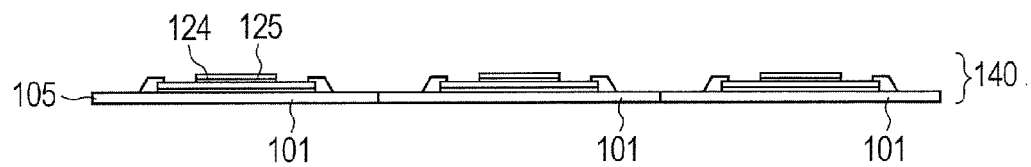
FIGS. 3A, 3B, 3C, and 3D are explanatory diagrams illustrating manufacturing steps of the multilayered semiconductor device according to the first embodiment.
Figure 3B:
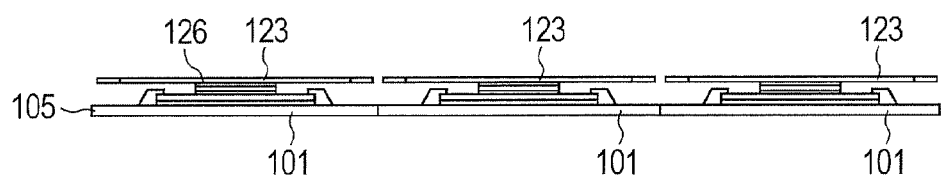
Figure 3C:
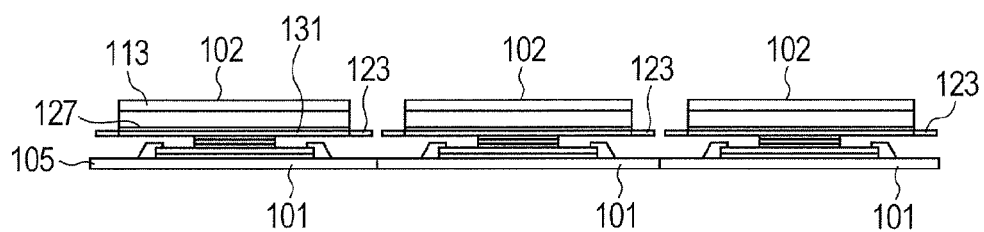
Figure 3D:
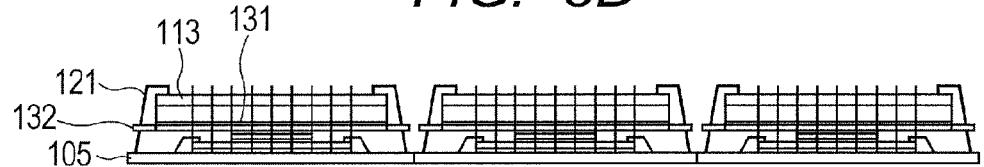
Figure 4A:
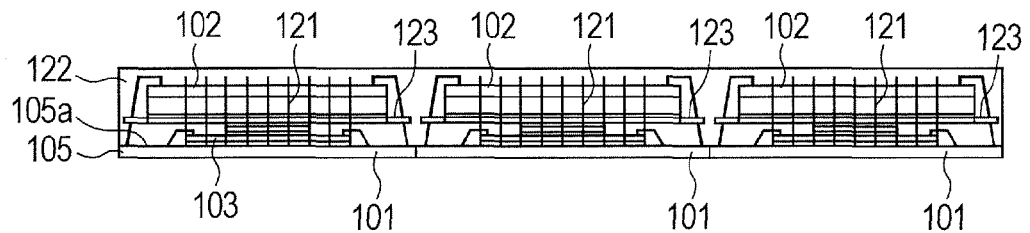
FIGS. 4A, 4B, 4C, and 4D are explanatory diagrams illustrating manufacturing steps of the multilayered semiconductor device according to the first embodiment.
Figure 4B:
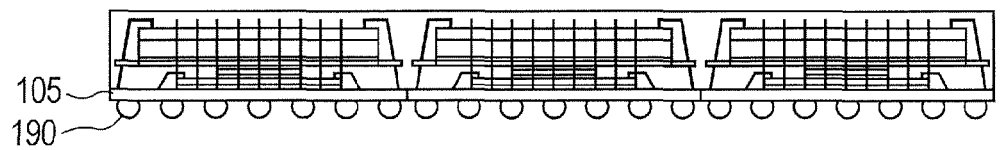
Figure 4C:
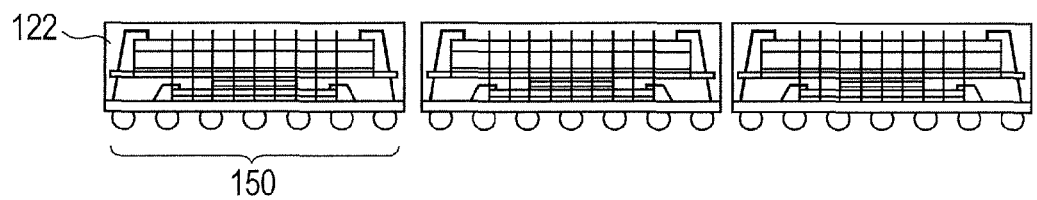
Figure 4D:
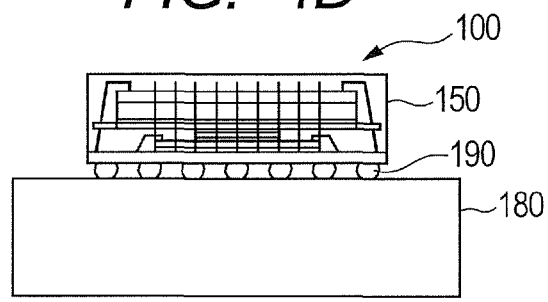

FIGS. 3A to 3D and FIGS. 4A to 4D are explanatory diagrams illustrating exemplary manufacturing steps of the multilayered semiconductor device 150 of the printed circuit board 100 according to the first embodiment of the present invention. FIG. 3A is an explanatory diagram illustrating a spacer fixing step in the manufacturing steps of the multilayered semiconductor device 150. FIG. 3B is an explanatory diagram illustrating a first fixing step in the manufacturing steps of the multilayered semiconductor device 150. FIG. 3C is an explanatory diagram illustrating a second fixing step in the manufacturing steps of the multilayered semiconductor device 150. FIG. 3D is an explanatory diagram illustrating a wire bonding step in the manufacturing steps of the multilayered semiconductor device 150. FIG. 4A is an explanatory diagram illustrating an encapsulating step in the manufacturing steps of the multilayered semiconductor device 150. FIG. 4B is an explanatory diagram illustrating an external connection terminal attaching step in the manufacturing steps of the multilayered semiconductor device 150. FIG. 4C is an explanatory diagram illustrating a dividing step in the manufacturing steps of the multilayered semiconductor device 150. FIG. 4D is an explanatory diagram illustrating a mounting step of mounting the manufactured multilayered semiconductor device 150 on the main board 180.

First, as illustrated in FIG. 3A, the spacer 125 is adhered to a sheet-like semiconductor device 140 which is formed by coupling multiple first semiconductor packages 101 using a thermosetting resin sheet as the adhesive 124, and the adhesive 124 is thermally cured.

Then, as illustrated in FIG. 3B, the plate member 123 is supplied onto each of the arranged multiple first semiconductor packages 101 and the plate members 123 are fixed to the first semiconductor packages 101, respectively. Specifically, the plate members 123 are adhered onto the spacers 125 provided on the semiconductor packages 101 by using a thermosetting resin sheet as the adhesive 126, and the adhesive 126 is thermally cured. In this case, each of the plate members 123 includes, as illustrated in FIG. 1B, the plate body 131 and the protruding pieces 132, and the plate bodies 131 of the plate members 123 are fixed onto the first semiconductor packages 101, respectively. At that time, each of the plate bodies 131 is fixed at a location at which the plate body 131 does not extend farther from the rim of a first wiring board 105 seen from the direction perpendicular to the surface of the first wiring board 105, that is, on the spacer 125 on the first semiconductor chip 103.

Then, as illustrated in FIG. 3C, the second semiconductor package 102 is supplied onto each of the plate members 123, and the second semiconductor packages 102 are fixed to the plate members 123, respectively. Specifically, the second semiconductor packages 102 are adhered onto the plate members 123 by using a thermosetting resin sheet as the adhesive 127, and the adhesive 127 is thermally cured. At that time, each of the second wiring boards 113 is fixed at a location at which the second wiring board 113 does not extend farther from the rim of a first wiring board 105 seen from the direction perpendicular to the surface of the first wiring board 105, that is, on the plate body 131.

Then, as illustrated in FIG. 3D, the first wiring boards 105 and the second wiring boards 113 are electrically connected, respectively, by wire bonding using the metal wires 121. In this case, the area of each of the second wiring boards 113 is smaller than the area of each of the first wiring boards 105, and each of the second wiring boards 113 is disposed within the region of a first wiring board 105 and does not extend farther from the rim of the first wiring board 105, as seen from the direction perpendicular to the surface of the first wiring board 105. Further, the area of each of the plate bodies 131 is equal to or smaller than the area of each of the second wiring boards 113 seen from the direction perpendicular to the surface of the first wiring board 105, and each of the plate bodies 131 is disposed within the region of a second wiring board 113, and thus, does not extend farther from the rim of the second wiring board 113. Therefore, the plate bodies 131 do not interfere with wire bonding operation, and the workability of wire bonding is good.

Then, as illustrated in FIG. 4A, the plate members 123 are encapsulated together with the first semiconductor packages 101, the metal wires 121, and the second semiconductor packages 102 collectively in the second encapsulating resin 122. Specifically, the one surfaces 105a of the first wiring boards 105, the first semiconductor chips 103, the metal wires 121, the second semiconductor packages 102, and the plate members 123 are collectively encapsulated in the second encapsulating resin 122. At that time, the encapsulation is made by transfer mold using a thermosetting resin containing silica as the second encapsulating resin 122, and the second encapsulating resin 122 is thermally cured.

Then, as illustrated in FIG. 4B, solder balls as the external connection terminals 190 are mounted on the pads on the lower surfaces of the first wiring boards 105, and connection is made by reflowing. Then, as illustrated in FIG. 4C, the sheet-like semiconductor device 140 is cut by dicing together with the second encapsulating resin 122 to be divided into the respective multilayered semiconductor devices 150. Then, as illustrated in FIG. 4D, the multilayered semiconductor device 150 is connected via the external connection terminals 190 to the main board 180 by reflowing.

By manufacturing the multilayered semiconductor device 150 by such a manufacturing method, distortion which occurs in the external connection terminals 191 connected to the four corners of the multilayered semiconductor device 150 can be reduced without performing particular processing to the first semiconductor package 101 and the second semiconductor package 102 in advance. Further, even when the shapes of the first semiconductor package 101 and the second semiconductor package 102 to be combined are changed, the shape of the plate member 123 can be changed with ease accordingly.

Note that, in the first fixing step of the first embodiment, a sheet-like plate material formed by coupling multiple plate members may be supplied onto the first semiconductor packages. In that case, in the dividing step, the sheet-like plate material and the sheet-like semiconductor device are cut together with the second encapsulating resin.

Next, in order to confirm the effect of the printed circuit board 100, shear stress which occurs at the external connection terminals 190 provided on the multilayered semiconductor device 150 was calculated by structural analysis. The temperature conditions were 125° C. on the high temperature side and −25° C. on the low temperature side, which are conditions of a temperature cycling test which is generally conducted as a reliability test.

A structural analysis model of the first semiconductor package 101 of the multilayered semiconductor device 150 was set as follows. The first wiring board 105 was a glass epoxy substrate which had the shape of a square of 18 mm×18 mm having a thickness of 0.5 mm, a linear expansion coefficient of 1.47 E-05/K, and a Young's modulus of 39 Gpa and which used copper foil as the conductor. A structural analysis model of the first semiconductor chip 103 was an Si semiconductor chip which had the shape of a square of 7 mm×7 mm having a thickness of 0.08 mm, a linear expansion coefficient of 2.50 E-06/K, and a Young's modulus of 170 Gpa. The first semiconductor chip 103 was connected to the first wiring board 105 by being mounted in a face down state. A thermosetting resin containing silica having a thickness of 0.02 mm, a linear expansion coefficient of 3.30 E-05/K, and a Young's modulus of 7 Gpa protected the connection between the first semiconductor chip 103 and the first wiring board 105. Further, as the external connection terminals 190, solder balls having a diameter of 0.3 mm and a height of 0.3 mm were arranged at a pitch of 0.5 mm on the lower surface of the first wiring board 105. The solder balls had a linear expansion coefficient of 2.1 E-05/K and a Young's modulus of 44 Gpa.

A structural analysis model of the second semiconductor package 102 was set as follows. The second semiconductor package 102 had a structure in which two second semiconductor chips 111 were mounted in a face up state and encapsulation was made by the first encapsulating resin 115.

The second wiring board 113 was a glass epoxy substrate which had the shape of a square of 14 mm×14 mm having a thickness of 0.24 mm, a linear expansion coefficient of 1.47 E-05/K, and a Young's modulus of 39 Gpa and which used copper foil as the conductor. The second semiconductor chip 111 was an Si semiconductor chip which had the shape of a square of 7 mm×7 mm having a thickness of 0.06 mm, a linear expansion coefficient of 2.50 E-06/K, and a Young's modulus of 170 Gpa. A first second semiconductor chip was adhered to the second wiring board 113 using a thermosetting resin sheet, and a second semiconductor chip was adhered onto the first second semiconductor chip using a thermosetting resin sheet. The thermosetting resin sheet had the shape of a square of 7 mm×7 mm having a thickness of 0.02 mm, a linear expansion coefficient of 7.3 E-05/K, and a Young's modulus of 2.4 Gpa. The first encapsulating resin 115 was a thermosetting resin containing silica having a thickness of 0.31 mm from the surface of the second wiring board 113, a linear expansion coefficient of 1.13 E-05/K, and a Young's modulus of 20 Gpa.

The plate member 123 had a thickness of 0.05 mm. From four corners of the plate body 131 having the shape of a square of 14 mm×14 mm, the protruding pieces 132 having a width of 2 mm extended toward the respective four corners 108 of the first wiring board 105, and end faces thereof were flush with end faces of the first wiring board 105.

The material of the plate member 123 was a copper alloy. The plate member 123 had a linear expansion coefficient of 1.7 E-05/K and a Young's modulus of 127 Gpa. The protruding pieces 132 of the plate member 123 were formed so as to cover directly above the solder balls as the external connection terminals 191 located in the corners 108, respectively.

The adhesive for adhering the first semiconductor package 101 and the plate member 123 and the adhesive for adhering the plate member 123 and the second semiconductor package 102 were a thermosetting resin containing silica. The thermosetting resin containing silica had a thickness of 0.02 mm, a linear expansion coefficient of 8.0 E-05/K, and a Young's modulus of 33 Gpa. The thermosetting resin containing silica between the first semiconductor package 101 and the plate member 123 had the shape of a square of 7 mm×7 mm, and the thermosetting resin containing silica between the plate member 123 and the second semiconductor package 102 had the shape of a square of 14 mm×14 mm.

In encapsulating the first semiconductor package 101, the second semiconductor package 102, and the plate member 123, a thermosetting resin containing silica was used as the first encapsulating resin. The thermosetting resin containing silica had a thickness of 0.89 mm from the surface of the first wiring board 105, a linear expansion coefficient of 1.13 E-05/K, and a Young's modulus of 20 Gpa.

The main board 180 to which the multilayered semiconductor device 150 was connected via the solder balls was a glass epoxy substrate which had the shape of a square of 36 mm×36 mm, and had a thickness of 0.5 mm, a linear expansion coefficient of 1.47 E-05/K, and a Young's modulus of 39 Gpa and which used copper foil as the conductor. All the layers in the multilayered semiconductor device 150 except for the solder balls are coaxially stacked.

Also with regard to a comparative multilayered semiconductor device without the plate member, shear stress which occurred at external connection terminals of the multilayered semiconductor device was calculated by structural analysis.

As the first semiconductor package of the multilayered semiconductor device without the plate member, the model of the first semiconductor package 101 according to the first embodiment was used. As the second semiconductor package of the multilayered semiconductor device without the plate member, a model of a second semiconductor package was used in which the encapsulating resin was thicker by 0.07 mm than that of the second semiconductor package 102 according to the first embodiment for not using the plate member.

The adhesive for adhering the first semiconductor package and the adhesive for adhering the second semiconductor package of the multilayered semiconductor device without the plate member were, similarly to the case of the model of the multilayered semiconductor device according to the first embodiment, a thermosetting resin containing silica. The thermosetting resin containing silica had the shape of a square of 7 mm×7 mm, and had a thickness of 0.02 mm, a linear expansion coefficient of 8.0 E-05/K, and a Young's modulus of 33 Gpa.

In encapsulating the first semiconductor package and the second semiconductor package 102 of the multilayered semiconductor device without the plate member, a thermosetting resin containing silica was used as the encapsulating resin. The thermosetting resin containing silica had a thickness of 0.82 mm from the surface of the first wiring board, a linear expansion coefficient of 1.13 E-05/K, and a Young's modulus of 20 Gpa, similarly to the case of the model of the multilayered semiconductor device according to the first embodiment. Also, with regard to the model of the multilayered semiconductor device without the plate member, all the layers except for the solder balls are coaxially stacked. The main board was, similarly to the case of the model of the multilayered semiconductor device according to the first embodiment, a glass epoxy substrate which had the shape of a square of 36 mm×36 mm, and had a thickness of 0.5 mm, a linear expansion coefficient of 1.47 E-05/K, and a Young's modulus of 39 Gpa and which used copper foil as the conductor.

Figure 5:
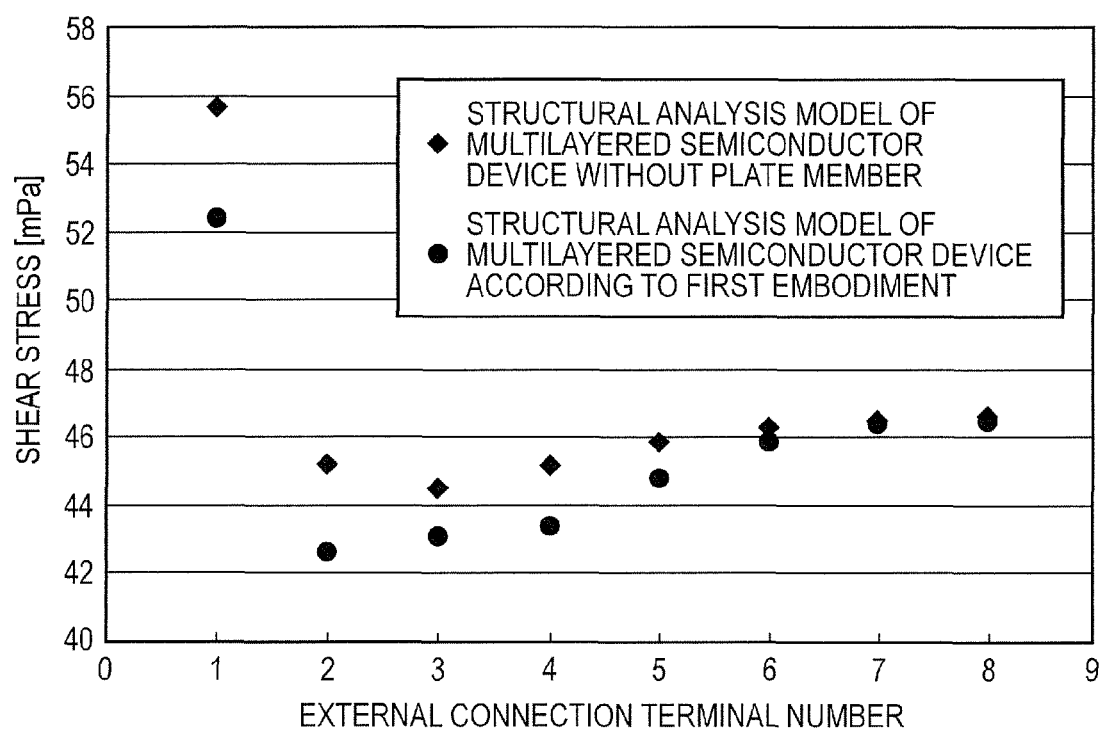
FIG. 5 is a graph showing the result of shear stress which occurs at external connection terminals of the multilayered semiconductor device according to the first embodiment.

FIG. 5 is a graph showing the result of comparison of shear stress which occurs at external connection terminals between the multilayered semiconductor device of the printed circuit board according to the first embodiment of the present invention and the multilayered semiconductor device without the plate member. Among the multiple external connection terminals, an external connection terminal which was an external connection terminal at the rim and which corresponded to a corner of the first wiring board was denoted as No. 1, and the rest of the external connection terminals were numbered in sequence along the rim of the substrate. With regard to the external connection terminals of the model of the multilayered semiconductor device according to the first embodiment, the plate-like protruding pieces respectively covered directly above the external connection terminals Nos. 1 to 3, and half of the external connection terminal No. 4 was covered with the plate-like protruding piece.

As illustrated in FIG. 5, the highest stress occurs at the external connection terminal in a corner of the substrate, but it could be confirmed that, with regard to the external connection terminal of the multilayered semiconductor device according to the first embodiment, the shear stress was reduced by about 10% due to the protruding piece of the plate member.

Next, distortion which occurred in the external connection terminals located in the four corners of the first wiring board was calculated using the model of the structure of the multilayered semiconductor device according to the first embodiment and the model of the structure of the multilayered semiconductor device without the plate member.

In the case of the structure of the multilayered semiconductor device without the plate member, the distortion which occurred in the external connection terminals in the four corners of the first wiring board was about 0.0084. On the other hand, in the case of the structure of the multilayered semiconductor device according to the first embodiment, the distortion which occurred in the external connection terminals in the four corners of the first wiring board was about 0.0040, which was less than half of that of the comparative example.

Next, using the values of the distortion, based on YU, Qiang and SHIRATORI, Masaki "Effects of BGA Solder Geometry on Fatigue Life and Reliability Assessment," Journal of Japan Institute of Electronics Packaging, 1[4] pp. 278-283 (1998), the life before fracture of the external connection terminals was confirmed by a temperature cycling test.

In the case of the structure of the multilayered semiconductor device without the plate member, the life before fracture of the external connection terminals in the four corners of the first wiring board corresponded to about 1,400 cycles. On the other hand, the life before fracture of the external connection terminals of the structure of the multilayered semiconductor device according to the first embodiment corresponded to about 6,300 cycles, and it could be confirmed that the reliability of the connection was improved more than four times as much as that of the comparative example.

(Second Embodiment)

Figure 6A:
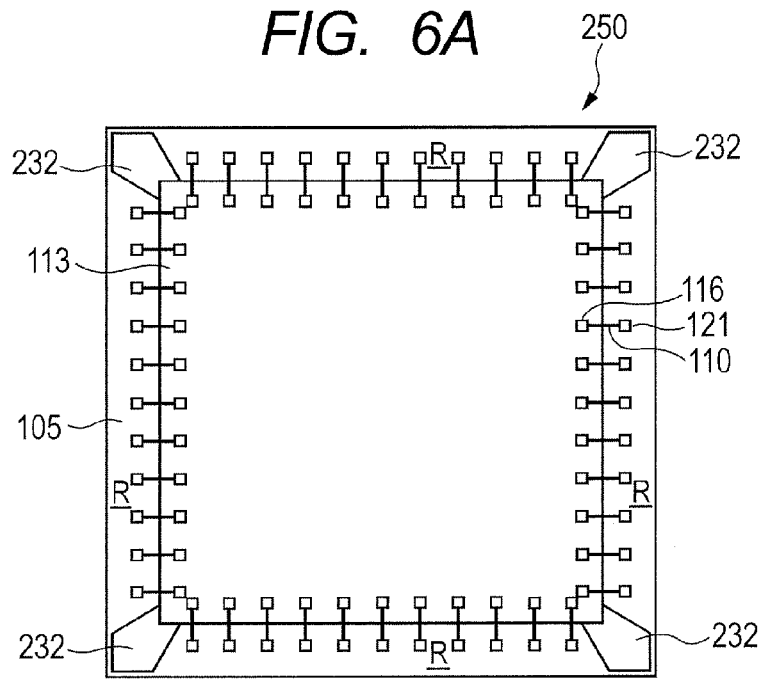
FIGS. 6A and 6B are schematic views of a multilayered semiconductor device according to a second embodiment of the present invention.
Figure 6B:
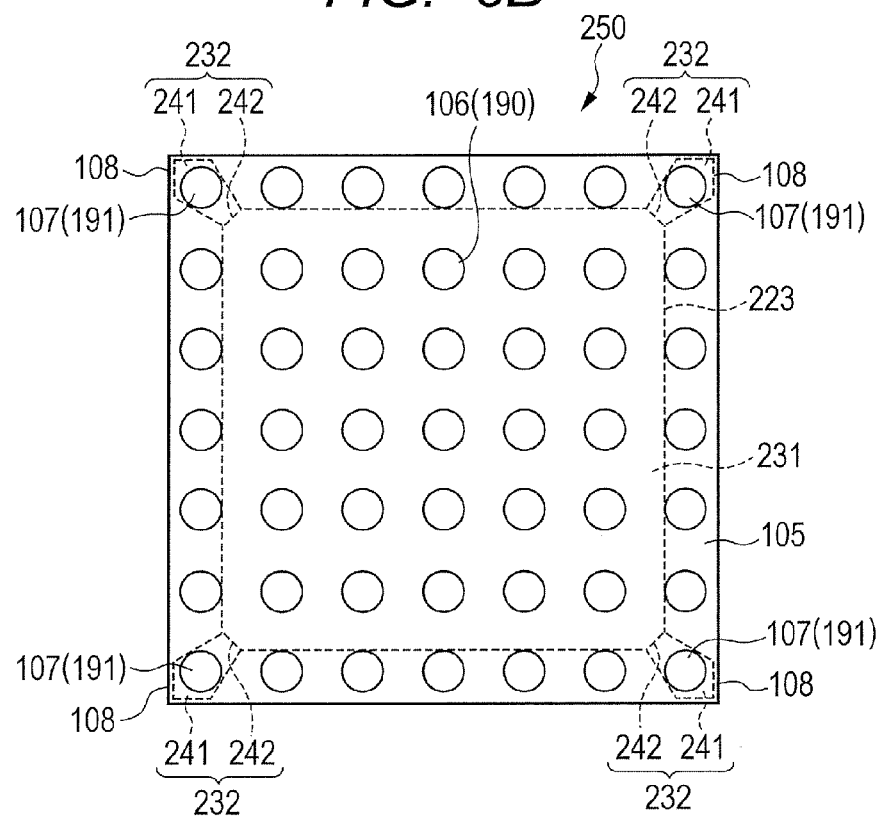

Next, a multilayered semiconductor device of a printed circuit board according to a second embodiment of the present invention is described. FIGS. 6A and 6B are explanatory diagrams illustrating a schematic structure of the multilayered semiconductor device of the printed circuit board according to the second embodiment of the present invention. FIG. 6A is a plan view of the multilayered semiconductor device, and FIG. 6B is a bottom view of the multilayered semiconductor device. Note that, in the multilayered semiconductor device of the second embodiment illustrated in FIGS. 6A and 6B, like reference numerals are used to designate members similar to those of the multilayered semiconductor device of the above-mentioned first embodiment, and description thereof is omitted.

A multilayered semiconductor device 250 of the second embodiment includes a plate member 223 having a shape different from that of the plate member 123 of the above-mentioned first embodiment. The plate member 223 is, similarly to the plate member of the above-mentioned first embodiment, a member having a linear expansion coefficient larger than those of the first and second encapsulating resins (not shown).

The plate member 223 includes a substantially square plate body 231 having an area which is smaller than the area of the first wiring board 105 seen from the direction perpendicular to the surface of the first wiring board 105, and four protruding pieces 232 which protrude from respective corners of the plate body 231.

Each of the protruding pieces 232 is formed so as to protrude from the plate body 231 to the location of one of the four corner pads 107 disposed in the respective four corners 108 of the first wiring board 105 among the multiple pads 106 seen from the direction perpendicular to the surface of the first wiring board 105.

In this way, the first wiring board 105 has the shape of a square, and thus, it is preferred that the plate member 223 have four protruding pieces 232 so as to correspond to the four corners 108. Note that, the number of the protruding pieces 232 may be less than four, and is not limited to four. In this case, the region R between adjacent two protruding pieces 232 is a region for routing the metal wires 121.

Each of the protruding pieces 232 includes a tip portion 241 formed so as to cover the contour of a corner pad 107 seen from the direction perpendicular to the surface of the first wiring board 105, and a coupling portion 242 which couples the plate body 231 and the tip portion 241 and which has a width smaller than that of the tip portion 241. In the second embodiment, the protruding pieces 232 are shaped so as to be widened toward the corners 108, respectively.

By forming the coupling portions 242 to be narrow, the protruding pieces 232 cover directly above the corner pads 107 (external connection terminals 191) in the four corners 108 of the first wiring board 105, and still, the area of the region R through which the metal wires 121 are passed can be larger than that in the first embodiment. The area of the region R through which the metal wires 121 are passed seen from the direction perpendicular to the surface of the first wiring board 105 can be increased, and thus, the number of the metal wires 121 can be increased, and the amount of information which can be processed at a time in the multilayered semiconductor device 250 can be increased. This can cause the multilayered semiconductor device 250 to be more sophisticated in functionality. Further, the tip portions 241 of the protruding pieces 232 cover the corner pads 107 (external connection terminals 191) seen from the direction perpendicular to the surface of the first wiring board 105, and thus, the effect of reducing distortion which occurs in the external connection terminals 191 by the protruding pieces 232 is maintained.

(Third Embodiment)

Figure 7A:
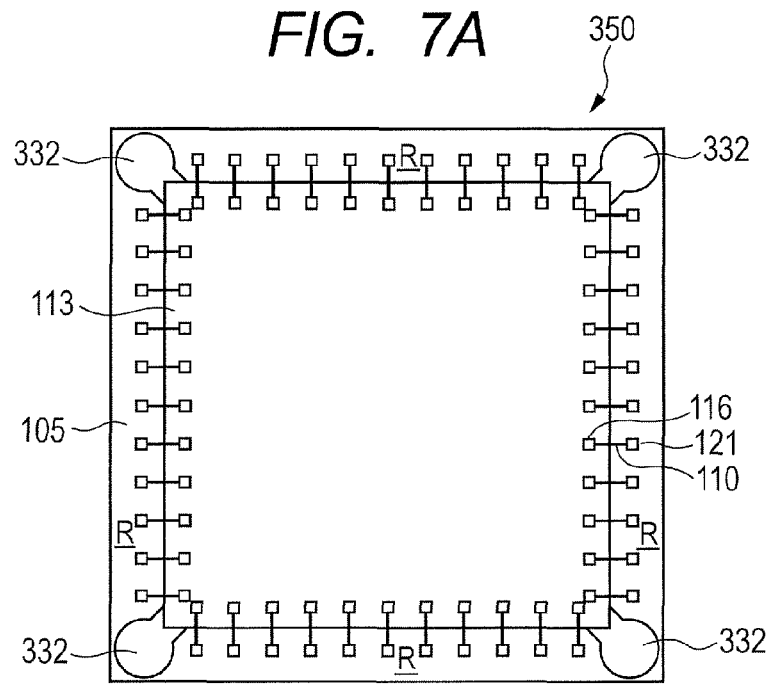
FIGS. 7A and 7B are schematic views of a multilayered semiconductor device according to a third embodiment of the present invention.
Figure 7B:
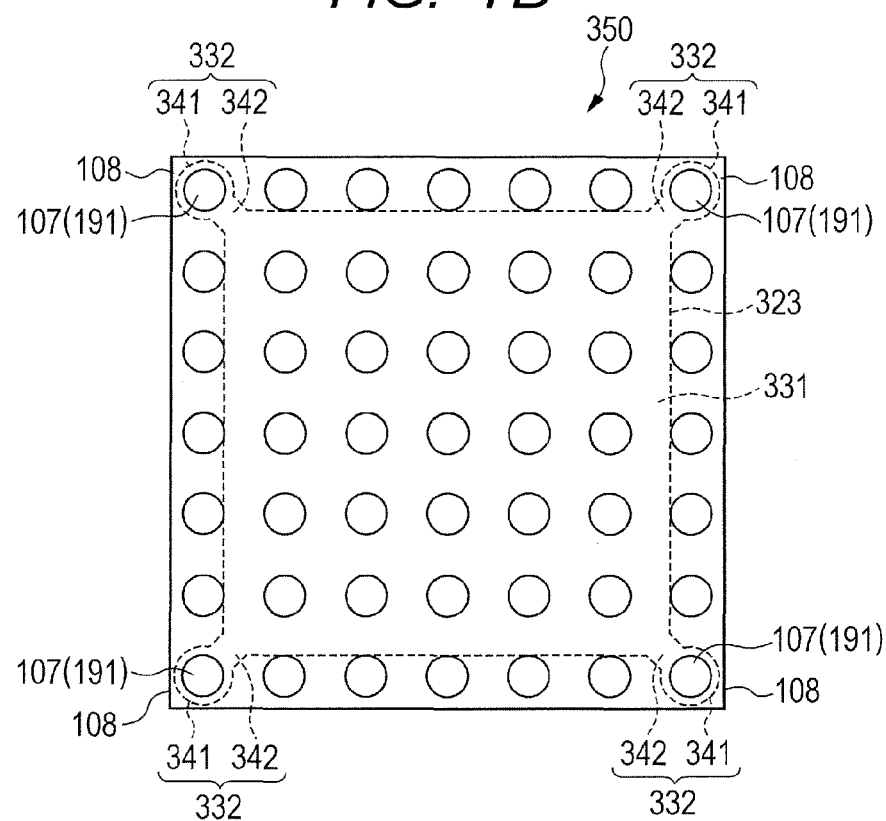

Next, a multilayered semiconductor device of a printed circuit board according to a third embodiment of the present invention is described. FIGS. 7A and 7B are explanatory diagrams illustrating a schematic structure of the multilayered semiconductor device of the printed circuit board according to the third embodiment of the present invention. FIG. 7A is a plan view of the multilayered semiconductor device, and FIG. 7B is a bottom view of the multilayered semiconductor device. Note that, in the multilayered semiconductor device of the third embodiment illustrated in FIGS. 7A and 7B, like reference numerals are used to designate members similar to those of the multilayered semiconductor device of the above-mentioned first embodiment, and description thereof is omitted.

A multilayered semiconductor device 350 of the third embodiment includes a plate member 323 having a shape different from those of the plate members 123 and 223 of the above-mentioned first and second embodiments. The plate member 323 is, similarly to the plate members of the above-mentioned first and second embodiments, a member having a linear expansion coefficient larger than those of the first and second encapsulating resins (not shown).

The plate member 323 includes a substantially square plate body 331 having an area which is smaller than the area of the first wiring board 105 seen from the direction perpendicular to the surface of the first wiring board 105, and four protruding pieces 332 which protrude from respective corners of the plate body 331.

Each of the protruding pieces 332 is formed so as to protrude from the plate body 331 to the location of one of the four corner pads 107 disposed in the respective four corners 108 of the first wiring board 105 among the multiple pads 106 seen from the direction perpendicular to the surface of the first wiring board 105.

In this way, the first wiring board 105 has the shape of a square, and thus, it is preferred that the plate member 323 have four protruding pieces 332 so as to correspond to the four corners 108. Note that, the number of the protruding pieces 332 may be less than four, and is not limited to four. In this case, the region R between adjacent two protruding pieces 332 is a region for routing the metal wires 121.

Each of the protruding pieces 332 includes a tip portion 341 formed so as to cover the contour of a corner pad 107 seen from the direction perpendicular to the surface of the first wiring board 105, and a coupling portion 342 which couples the plate body 331 and the tip portion 341 and which has a width smaller than that of the tip portion 341.

The shapes of the tip portions and the coupling portions of the protruding pieces are not limited to those of the above-mentioned second embodiment. Each of the tip portions 341 of the protruding pieces 332 may have the shape of a circle which covers directly above the contour of the corner pad 107 (external connection terminal 191) in one of the four corners 108 of the first wiring board 105. The plate body 331 and the tip portion 341 may be connected by the coupling portion 342 having a width smaller than the diameter of the circular tip portion 341.

Even by forming the protruding pieces 332 in such a shape, the tip portions 341 cover directly above the corner pads 107 (external connection terminals 191), and still, the area of the region R through which the metal wires 121 are passed can be larger than that in the above-mentioned first embodiment, which can cause the multilayered semiconductor device 350 to be more sophisticated in functionality.

Note that, the shape of the tip portions of the protruding pieces is not limited to those of the second and third embodiments. As long as the tip portions have areas large enough to cover directly above the contours of the external connection terminals 191, respectively, the tip portions may have in the shape of a polygon such as a triangle or a tetragon. Further, the shape of the coupling portions is not limited to those in the second and third embodiments.

(Fourth Embodiment)

Figure 8A:
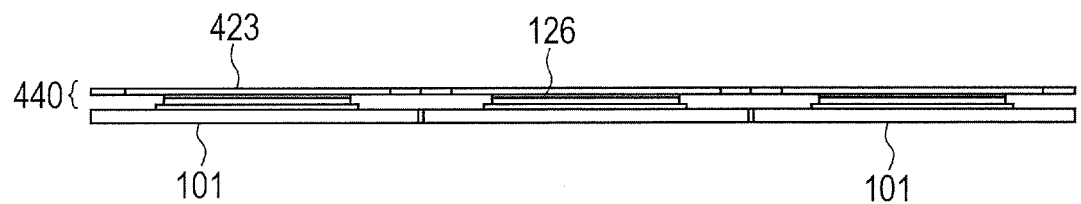
FIGS. 8A, 8B, 8C, and 8D are schematic views of a multilayered semiconductor device according to a fourth embodiment of the present invention.
Figure 8B:
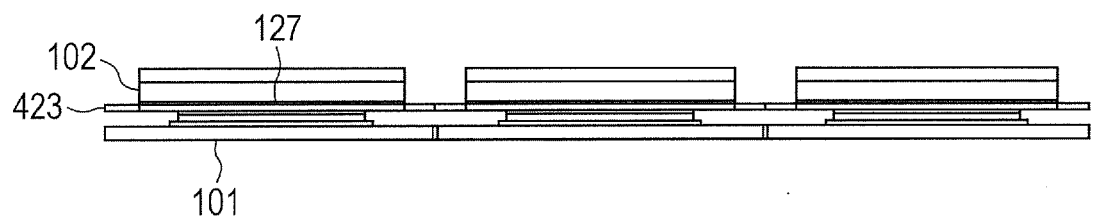
Figure 8C:
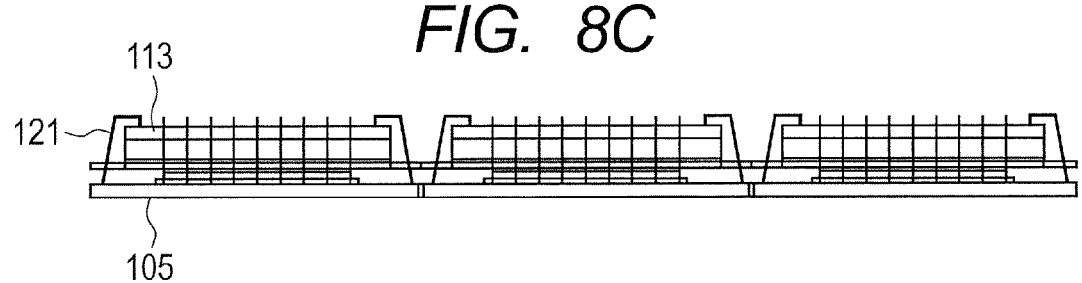
Figure 8D:
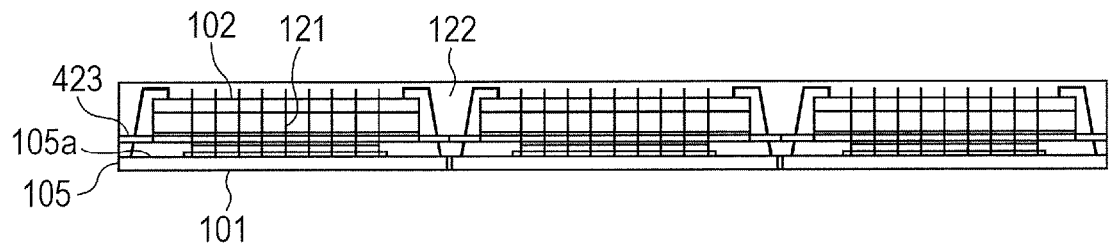
Figure 9A:
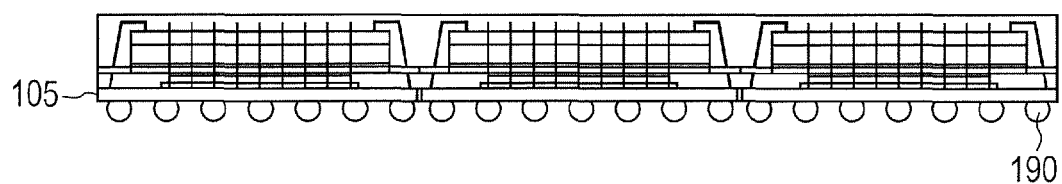
FIGS. 9A, 9B, and 9C are explanatory diagrams illustrating manufacturing steps of the multilayered semiconductor device according to the fourth embodiment.
Figure 9B:
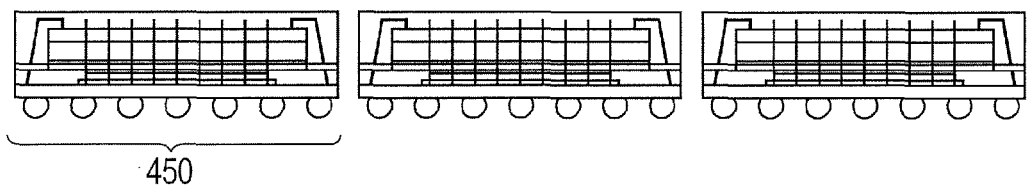
Figure 9C:
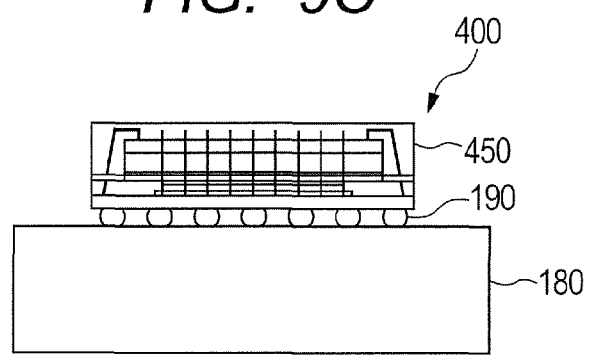

Next, a method of manufacturing a multilayered semiconductor device of a printed circuit board according to a fourth embodiment of the present invention is described. FIGS. 8A to 8D and FIGS. 9A to 9C are explanatory diagrams illustrating exemplary manufacturing steps of a multilayered semiconductor device 450 of a printed circuit board 400 according to the fourth embodiment of the present invention. FIG. 8A is an explanatory diagram illustrating a first fixing step in the manufacturing steps of the multilayered semiconductor device 450. FIG. 8B is an explanatory diagram illustrating a second fixing step in the manufacturing steps of the multilayered semiconductor device 450. FIG. 8C is an explanatory diagram illustrating a wire bonding step in the manufacturing steps of the multilayered semiconductor device 450. FIG. 8D is an explanatory diagram illustrating an encapsulating step in the manufacturing steps of the multilayered semiconductor device 450. FIG. 9A is an explanatory diagram illustrating an external connection terminal attaching step in the manufacturing steps of the multilayered semiconductor device 450. FIG. 9B is an explanatory diagram illustrating a dividing step in the manufacturing steps of the multilayered semiconductor device 450. FIG. 9C is an explanatory diagram illustrating a mounting step of mounting the manufactured multilayered semiconductor device 450 on the main board 180. In the above-mentioned first embodiment, the sheet-like semiconductor device which is formed by coupling multiple first semiconductor packages is used to manufacture a multilayered semiconductor device. In the fourth embodiment, a sheet-like plate material which is formed by coupling multiple plate members is used, and the first semiconductor packages are divided.

First, as illustrated in FIG. 8A, a sheet-like plate material 440 which is formed by coupling plate members 423 having a structure substantially similar to the plate members described in the above-mentioned first to third embodiments is supplied onto the divided multiple first semiconductor packages 101 and the plate members 423 are fixed to the first semiconductor packages 101, respectively. Specifically, the sheet-like plate material 440 in a coupled sheet-like state is adhered onto the first semiconductor packages 101 using a thermosetting resin sheet as the adhesive 126, and the adhesive 126 is thermally cured.

In the fourth embodiment, the sheet-like semiconductor device is divided into the respective first semiconductor packages 101, and thus, the first semiconductor packages 101 which have already undergone a test can be used. Similarly, the second semiconductor packages 102 are divided from one another, and thus, the second semiconductor packages 102 which have already undergone a test can be used. Therefore, in the fourth embodiment, prior to the first fixing step, operation of the respective first semiconductor packages 101 and the respective second semiconductor packages 102 is tested. In the first fixing step, the first and second semiconductor packages 101 and 102 which have already undergone a test are used.

Next, as illustrated in FIG. 8B, the second semiconductor package 102 is supplied onto each of the plate members 423 of the sheet-like plate material 440 and the second semiconductor packages 102 are fixed to the plate members 423, respectively. Specifically, the second semiconductor packages 102 are adhered onto the plate members 423, respectively, using a thermosetting resin sheet as the adhesive 127, and the adhesive 127 is thermally cured.

Then, as illustrated in FIG. 8C, the first wiring boards 105 and the second wiring boards 113 are electrically connected, respectively, by wire bonding using the metal wires 121.

Then, as illustrated in FIG. 8D, the plate members 423 are encapsulated together with the first semiconductor packages 101, the metal wires 121, and the second semiconductor packages 102 collectively in the second encapsulating resin 122. Specifically, the one surface 105a of the first wiring boards 105, the first semiconductor chips 103, the metal wires 121, the second semiconductor packages 102, and the plate members 423 are collectively encapsulated in the second encapsulating resin 122. At that time, the encapsulation is made by transfer mold using a thermosetting resin containing silica as the second encapsulating resin 122, and the second encapsulating resin 122 is thermally cured.

Then, as illustrated in FIG. 9A, solder balls as the external connection terminals 190 are mounted on the pads on the lower surfaces of the first wiring boards 105, and connection is made by reflowing. Then, as illustrated in FIG. 9B, the sheet-like plate material 440 is cut by dicing together with the second encapsulating resin 122 to be divided into the respective multilayered semiconductor devices 450.

In this case, in each of the divided multilayered semiconductor devices 450, unlike the cases of the above-mentioned first to third embodiments, end faces of the protruding pieces of the plate member 423 are exposed to the outside, and portions of the protruding pieces which are not the end faces are encapsulated in the second encapsulating resin 122. Even when part of the plate member 423 is not encapsulated in the second encapsulating resin 122 and is exposed to the outside in this way, most of the plate member 423 is encapsulated in the second encapsulating resin 122, and thus, it can be said that the plate member 423 is encapsulated in the second encapsulating resin 122.

Then, as illustrated in FIG. 9C, the multilayered semiconductor device 450 is connected via the external connection terminals 190 to the main board 180 by reflowing to manufacture the printed circuit board 400.

By manufacturing the multilayered semiconductor device 450 in this way, the necessity of dividing the plate members 423 in advance is eliminated, and thus, the productivity of the multilayered semiconductor device 450 can be improved.

Further, it is difficult to conduct a performance test with regard to a sheet-like semiconductor device, but, in the fourth embodiment, the divided semiconductor packages 101 are used, and thus, it is easy to conduct a performance test, and a screening test such as a burn-in test can also be conducted. Therefore, as the semiconductor packages 101 used in manufacturing the multilayered semiconductor device, semiconductor packages whose nondefectiveness is guaranteed in advance can be used, and thus, the multilayered semiconductor device 450 can be manufactured with an enhanced yield.

Further, by adhering the divided semiconductor packages 101 to the sheet-like plate material 440, the multiple semiconductor packages 101 can be collectively encapsulated in the second encapsulating resin 122, and thus, the productivity of the multilayered semiconductor device 450 can be improved.

Note that, the external connection terminals 190 may be formed on the lower surfaces of the semiconductor packages 101 in advance prior to adhering the plate members 423 and the second semiconductor package 102 thereto.

(Fifth Embodiment)

Figure 10A:
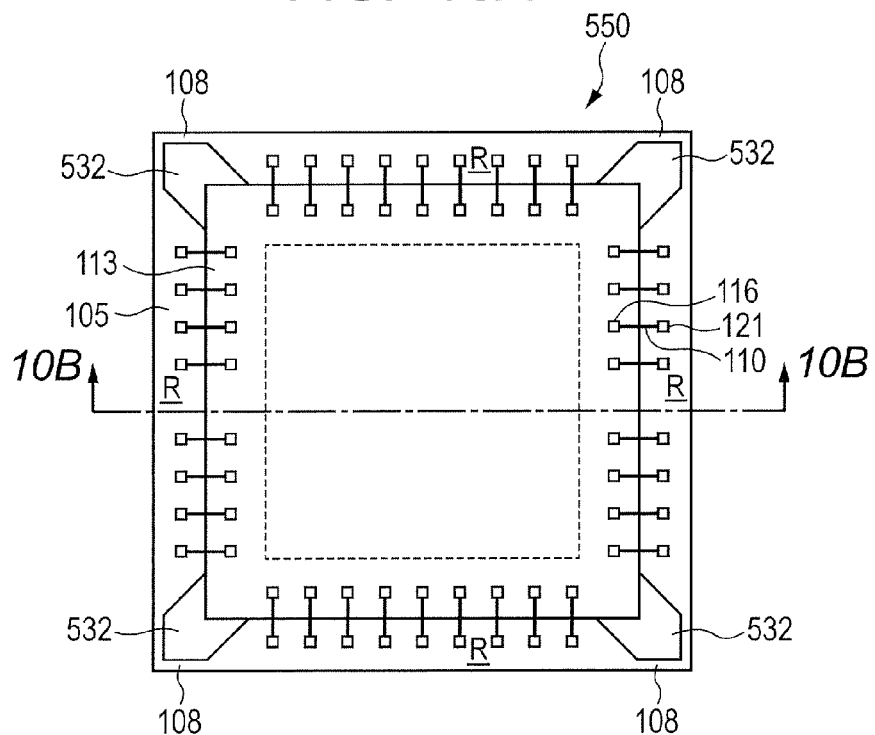
FIGS. 10A and 10B are schematic views of a multilayered semiconductor device according to a fifth embodiment of the present invention.
Figure 10B:
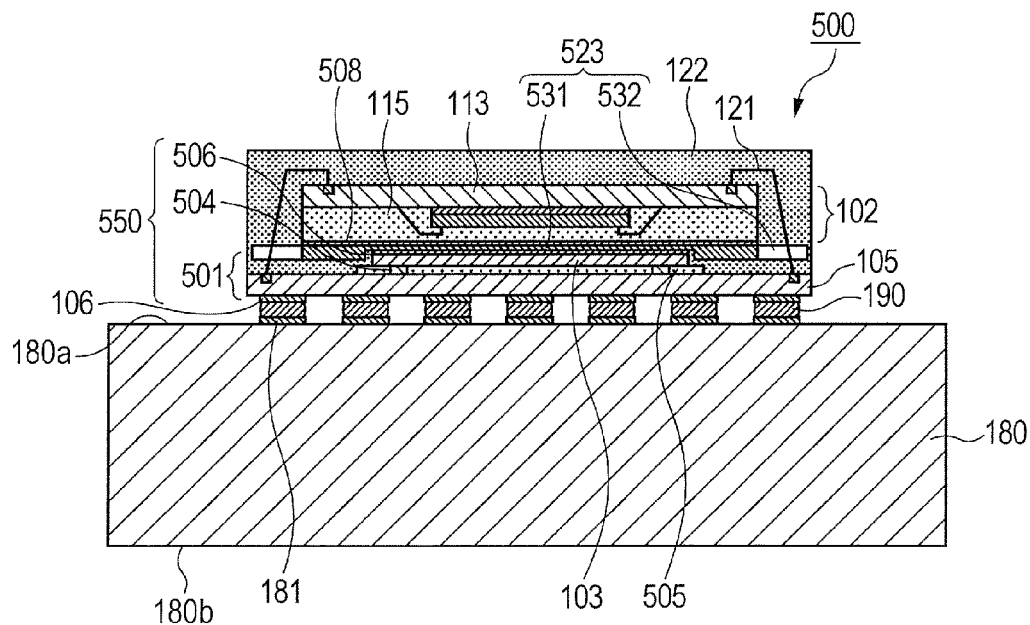

Next, a multilayered semiconductor device of a printed circuit board according to a fifth embodiment of the present invention is described. FIGS. 10A and 10B are explanatory diagrams illustrating a schematic structure of the multilayered semiconductor device of the printed circuit board according to the fifth embodiment of the present invention. FIG. 10A is a plan view of the multilayered semiconductor device, and FIG. 10B is a sectional view taken along the line 10B-10B of FIG. 10A. Note that, in the multilayered semiconductor device of the fifth embodiment illustrated in FIGS. 10A and 10B, like reference numerals are used to designate members similar to those of the multilayered semiconductor device of the above-mentioned first embodiment, and description thereof is omitted.

As illustrated in FIG. 10B, a printed circuit board 500 includes a multilayered semiconductor device 550 and the main board 180 as a printed wiring board. The multilayered semiconductor device 550 is mounted on the one surface 180a of the surfaces 180a and 180b of the main board 180. The multilayered semiconductor device 550 is a package in package (PiP) type multilayered semiconductor device, and includes a first semiconductor package 501 and the second semiconductor package 102 having a structure similar to that in the above-mentioned first embodiment.

The first semiconductor package 501 includes, similarly to the case of the above-mentioned first embodiment, the first semiconductor chip 103 and the first wiring board 105, but is different from the case of the above-mentioned first embodiment in that the first semiconductor chip 103 is mounted in a face down state on the first wiring board 105. The first semiconductor chip 103 is electrically connected to the first wiring board 105 via multiple protruding electrodes 504. The protruding electrodes 504 between the first semiconductor chip 103 and the first wiring board 105 are protected by an encapsulating resin 505 which fills the space between the first semiconductor chip 103 and the first wiring board 105.

The multilayered semiconductor device 550 of the fifth embodiment includes a plate member 523 having a shape different from that of the plate member 123 of the above-mentioned first embodiment. The plate member 523 is, similarly to the plate member of the above-mentioned first embodiment, a member having a linear expansion coefficient larger than those of the first encapsulating resin 115 and the second encapsulating resin 122.

The plate member 523 includes a substantially square plate body 531 having an area which is smaller than the area of the first wiring board 105 seen from the direction perpendicular to the surface of the first wiring board 105, and four protruding pieces 532 which protrude from respective corners of the plate body 531.

Each of the protruding pieces 532 is formed so as to protrude from the plate body 531 to the location of one of the four corner pads disposed in the respective four corners 108 of the first wiring board 105 among the multiple pads 106 seen from the direction perpendicular to the surface of the first wiring board 105.

In this way, the first wiring board 105 has the shape of a square, and thus, it is preferred that the plate member 523 have four protruding pieces 532 so as to correspond to the four corners. Note that, the number of the protruding pieces 532 may be less than four, and is not limited to four. In this case, the region R between adjacent two protruding pieces 532 is a region for routing the metal wires 121.

The plate member 523 is adhered onto the first semiconductor chip 103 of the first semiconductor package 501 using an adhesive 506. The first encapsulating resin 115 of the second semiconductor package 102 is adhered onto the plate member 523 using an adhesive 508. The electrodes 110 of the first wiring board 105 and the electrodes 116 of the second wiring board 113 are electrically connected via the metal wires 121, respectively. The plate member 523 is encapsulated together with the first semiconductor chip 103, the metal wires 121, and the second semiconductor package 102 in the second encapsulating resin 122. The multilayered semiconductor device 550 structured as described above is connected to the main board 180 via the external connection terminals 190 such as solder balls.

The protruding pieces 532 in the fifth embodiment are formed so as to be thicker than the plate body 531. The protruding pieces 532 are formed so as to be thicker than the plate body 531 in this way, and thus, the distortion force on the external connection terminals connected to the corner pads in the corners 108 of the first wiring board 105 can be effectively reduced, and distortion of the external connection terminals can be effectively reduced. Note that, the plate body 531 is formed so as to be relatively thinner than the protruding pieces 532, and thus, the thickness of the multilayered semiconductor device 550 can also be reduced.

Note that, the present invention is not limited to the embodiments described above, and various modifications can be made by those with an ordinary skill in the art within the technical idea of the present invention.

In each of the above-mentioned first to fifth embodiments, a case in which the multilayered semiconductor device does not have external connection terminals is described, but the multilayered semiconductor device may have external connection terminals connected to pads, respectively.

Further, in each of the above-mentioned first to fifth embodiments, a case in which the second semiconductor package is stacked on the first semiconductor package is described, but the present invention can also be applied to a case in which at least one semiconductor package is stacked on the second semiconductor package.

In each of the above-mentioned first to fifth embodiments, a case in which the area of the second wiring board is smaller than the area of the first wiring board is described, but the present invention is not limited thereto, and the second wiring board may have an area which is equal to or larger than the area of the first wiring board.

Further, the plate member in each of the above-mentioned first to fifth embodiments may further include a beam portion which couples tip portions of two adjacent protruding pieces and which leaves a region through which the metal wires 121 are passed.

Further, in each of the above-mentioned first to fifth embodiments, a case in which the protruding pieces of the plate member do not extend farther from the rim of the first wiring board seen from the direction perpendicular to the surface of the first wiring board is described, but the present invention is not limited thereto. Part of the protruding pieces may extend farther from the rim of the first wiring board seen from the direction perpendicular to the surface of the first wiring board. In this case, an end face or a portion, which extends farther from the rim of the first wiring board, of a protruding piece may not be covered with the second encapsulating resin, but most of the plate member is encapsulated in the encapsulating resin, and thus, it can be said that the plate member is encapsulated in the encapsulating resin.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-088555, filed Apr. 9, 2012, which is hereby incorporated by reference herein in its entirety.

What is claimed is:

1. A multilayered semiconductor device, comprising:
   a first semiconductor package, comprising:
      a first semiconductor element; and
      a first wiring board having the first semiconductor element mounted on one surface thereof and having a plurality of connection pads for electric connection to an outside formed on another surface thereof;
   a second semiconductor package, comprising:
      a second semiconductor element;
      a second wiring board having the second semiconductor element mounted on one surface thereof; and
      a first encapsulating resin for encapsulating the second semiconductor element therein; and
   a plate member disposed between the first semiconductor package and the second semiconductor package,
   wherein:
   the first semiconductor package, the plate member, and the second semiconductor package are stacked in this order;
   the first wiring board and the second wiring board are electrically connected to each other via a metal wire through one of a notch and an opening formed in the plate member; and
   the first semiconductor element, the second semiconductor package, and the metal wire are encapsulated in a second encapsulating resin.

2. The multilayered semiconductor device according to claim 1, wherein a linear expansion coefficient of the plate member is larger than linear expansion coefficients of the first encapsulating resin and the second encapsulating resin.

3. The multilayered semiconductor device according to claim 2, wherein an area of the plate member is smaller than an area of the first wiring board seen from a direction perpendicular to a surface of the first wiring board, and the notch is formed by a plate body disposed within a region of the first wiring board and a protruding piece which protrudes from the plate body to a location of a connection pad disposed in a corner of the first wiring board among the plurality of connection pads.

4. The multilayered semiconductor device according to claim 3, wherein an area of the second wiring board is smaller than the area of the first wiring board and the second wiring board is disposed within the region of the first wiring board seen from the direction perpendicular to the surface of the first wiring board, and an area of the plate body is equal to or smaller than the area of the second wiring board and the plate body is disposed within a region of the second wiring board seen from the direction perpendicular to the surface of the first wiring board.

5. The multilayered semiconductor device according to claim 3, wherein the protruding piece includes a tip portion and a coupling portion, the tip portion being formed so as to cover a contour of a corner pad seen from the direction perpendicular to the surface of the first wiring board, the coupling portion coupling the plate body and tip portion and having a width smaller than a width of the tip portion.

6. The multilayered semiconductor device according to claim 3, wherein the protruding piece is formed so as to be thicker than the plate body.

7. The multilayered semiconductor device according to claim 1, wherein one surface of the plate member is bonded to the first semiconductor element by a bonding member, and another surface of the plate member is bonded to the first encapsulating resin of the second semiconductor package.

8. A printed circuit board, comprising:
   a printed wiring board; and
   the multilayered semiconductor device according to claim 1 mounted on the printed wiring board.

9. A method of manufacturing a multilayered semiconductor device, the multilayered semiconductor device comprising:
   a first semiconductor package, the first semiconductor package comprising:
      a first semiconductor element; and
      a first wiring board having the first semiconductor element mounted on one surface thereof and having a plurality of connection pads formed on another surface thereof, the plurality of connection pads being formed of a conductor electrically connected to a printed wiring board; and
   a second semiconductor package, the second semiconductor package comprising:
      a second semiconductor element;
      a second wiring board having the second semiconductor element mounted on one surface thereof; and a first encapsulating resin for encapsulating the second semiconductor element therein, the method comprising:
- a step of arranging a plurality of first semiconductor packages;
- a step of disposing a plurality of plate members on the plurality of first semiconductor packages, each plate member having a linear expansion coefficient that is larger than a linear expansion coefficient of the first encapsulating resin and having one of a notch and an opening formed therein;
- a first fixing step of fixing the plurality of plate members to the plurality of first semiconductor packages, respectively;
- a step of supplying a plurality of second semiconductor packages onto the plurality of plate members;
- a second fixing step of fixing the plurality of second semiconductor packages to the plurality of plate members, respectively;
- a step of electrically connecting each of a plurality of first wiring boards and each of a plurality of second wiring boards via the notch or the opening by using metal wires;
- a step of collectively encapsulating a plurality of first semiconductor elements, the metal wires, and the plurality of second semiconductor packages in a second encapsulating resin, the second encapsulating resin having a linear expansion coefficient smaller than the linear expansion coefficient of the plurality of plate members; and
- a step of dividing a plurality of multilayered semiconductor devices by cutting the second encapsulating resin.

10. The method of manufacturing a multilayered semiconductor device according to claim 9, wherein:
- an area of each plate member is smaller than an area of the first wiring board seen from a direction perpendicular to a surface of the first wiring board;
- each notch is formed by a plate body disposed within a region of the first wiring board and a protruding piece that protrudes from the plate body to a location of a connection pad disposed in a corner of the first wiring board among the plurality of connection pads;
- the first fixing step includes fixing the plurality of first semiconductor packages to the plurality of plate bodies of the plurality of plate members, respectively; and
- the second fixing step includes fixing the plurality of second semiconductor packages to the plurality of plate bodies of the plurality of plate members, respectively.

11. The method of manufacturing a multilayered semiconductor device according to claim 9, wherein, for each plane member, one surface of the plate member is bonded to the first semiconductor element by a bonding member, and another surface of the plate member is bonded to the first encapsulating resin of the second semiconductor package.

12. The method of manufacturing a multilayered semiconductor device according to claim 9, wherein:
- the first fixing step includes supplying a sheet-like plate material in which the plurality of plate members are coupled onto the plurality of first semiconductor packages that have undergone a test; and
- the step of dividing includes cutting the sheet-like plate material together with the second encapsulating resin.

* * * * *